United States Patent
Lercel (12)

(10) Patent No.: US 6,635,389 B1
(45) Date of Patent: Oct. 21, 2003

(54) METHOD OF DEFINING AND FORMING MEMBRANE REGIONS IN A SUBSTRATE FOR STENCIL OR MEMBRANE MARKS

(75) Inventor: Michael J. Lercel, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 268 days.

(21) Appl. No.: 09/707,303

(22) Filed: Nov. 7, 2000

(51) Int. Cl.[7] ................................................. G03F 9/00
(52) U.S. Cl. ......................................................... 430/5
(58) Field of Search ........................... 430/5, 322, 323, 430/324, 296; 378/34, 35

(56) References Cited

U.S. PATENT DOCUMENTS

| | | | |
|---|---|---|---|
| 4,260,670 A | 4/1981 | Burns | |
| 4,827,138 A | 5/1989 | Randall | |
| 5,111,491 A | 5/1992 | Imai et al. | |
| 5,260,151 A | 11/1993 | Berger et al. | |
| 5,728,492 A | 3/1998 | Kawata | |
| 5,781,607 A | 7/1998 | Acosta et al. | |
| 5,798,194 A | 8/1998 | Nakasuji et al. | |
| 5,876,881 A | 3/1999 | Kawata | |
| 5,899,728 A | * 5/1999 | Mangat et al. | ............ 438/459 |
| 5,962,174 A | * 10/1999 | Pierrat | ........................... 430/5 |
| 5,972,794 A | 10/1999 | Katakura | |

FOREIGN PATENT DOCUMENTS

| | | |
|---|---|---|
| JP | POPA 7-176462 | 7/1995 |
| JP | POPA 11-111614 | 4/1999 |

OTHER PUBLICATIONS

Performance Materials, Inc., "Performance SiC", Semiconductor International, Jul. 1999, p. 42.

* cited by examiner

*Primary Examiner*—Mark F. Huff
*Assistant Examiner*—Saleha R. Mohamedulla
(74) *Attorney, Agent, or Firm*—McGinn & Gibb, PLLC; Richard M. Kotulak, Esq.

(57) ABSTRACT

A method and structure for forming subfield regions includes mechanical definition of the substrate through machining or mold forming. The subfield regions are filled with a sacrificial layer before the thin membranes are deposited. Slots are mechanically machined through a substrate (the slots have dimensions of membrane subfields) and filled with a sacrificial material. The substrate is planarized. A membrane material is deposited over the substrate and patterned. The sacrificial layer is then removed. A mold can be utilized to form the slotted substrate in place of the machining operation.

39 Claims, 5 Drawing Sheets

METHOD OF DEFINING AND FORMING MEMBRANE REGIONS IN A SUBSTRATE FOR STENCIL OR MEMBRANE MARKS

FEDERAL RESEARCH STATEMENT

This invention was made with United States Government support under Agreement No. N00019-99-3-1366 awarded by the Naval Air Systems Command. The United States Government has certain rights in this invention.

BACKGROUND OF THE INVENTION

1. Field of the Invention

The present invention generally relates to the fabrication of stencil or membrane masks for high-resolution lithography, and more particularly to an improved method of forming a substrate for such masks.

2. Description of the Related Art

During the fabrication of stencil or membrane masks for high-resolution lithography, one or many membrane regions 10 are defined in a thick substrate material, as shown in FIG. 1. Small spaces or struts 11 between these membranes 10 (the membranes often referred to as membrane subfields) act as mechanical support for the thin membranes 10. It is advantageous for these struts 11 to be vertical to maximize the useable area on the mask surface. The membranes 10 are typically 1 mm×12 mm for e-beam projection lithography (EPL) and may be as large as 50 mm×50 mm for x-ray (including Extreme Ultraviolet (EUV)) or ion projection lithography (IPL). The effective field sizes are defined by the exposure system and the tolerances on the membrane dimensions are large.

The membrane regions 10 are typically defined by patterning a resist layer on the backside of the substrate (almost always silicon) and then etching the silicon through a wet etch or Reactive Ion Etch (RIE) using a hardmask. The wet etch either leaves tapered profiles (from the crystalline silicon (100) planes) which reduce the useable area of the mask, or requires silicon (110) wafers that etch along the crystal planes to leave vertical strut profiles, but are more expensive and produce vertical profiles in only one direction. The wet etch is designed to stop on the membrane material with high selectivity. Typically, the wet etch takes several hours (but can be done in batches).

For example, U.S. Pat. No. 5,464,711 to C. J. Mogab et al. (hereinafter "Mogab"), discloses that defining the membrane regions with an RIE allows vertical strut profiles in all substrate materials with all orientations. However, the process in Mogab takes several hours per substrate (and usually is a single wafer process) which is expensive in a dedicated RIE system. Further, with the system in Mogab, the RIE must also stop on the membrane material and since RIE's are typically less selective than wet etches, the etch is either stopped close to the membrane (and finished with a wet etch) or some barrier layer is used underneath the membrane material.

Other convention methods of forming masks include electrodeposition of metal onto a substrate and subsequent removal of the substrate. This, however, limits the choice of substrate and membrane materials and is rarely used in practice.

Therefore, there is a need for a method and system that forms membrane masks utilizing a simpler and less expensive processes. The invention described below provides a process which reduces the cost and time required to form such membrane masks.

SUMMARY OF THE INVENTION

The following disclosure describes a process for forming subfield regions by mechanical definition of the substrate through machining or mold forming. The subfield regions are then filled with a sacrificial layer before the thin membranes are deposited.

More specifically, the invention mechanically machines slots through a substrate (the slots have dimensions of membrane subfields), fills the slots with a sacrificial material, planarizes the substrate, deposits a membrane material over the substrate, patterns the membrane material and removes the sacrificial material. In a different but related embodiment, the invention utilizes a mold to form the slotted substrate in place of the machining operation.

In another embodiment, the invention deposits a lithographic mask material on a sacrificial material, machines slots in the substrate, attaches the sacrificial material to the substrate, removes the sacrificial material, and patterns the lithographic mask material.

The machining involves applying a cutting tool to the substrate to form the slots. Before the depositing of the membrane material, the invention can optionally deposit an intermediate layer, to assists the nucleation of the membrane material. The patterned membrane material regions are positioned above the slots. The sacrificial material provides support for the lithographic mask material.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 1:
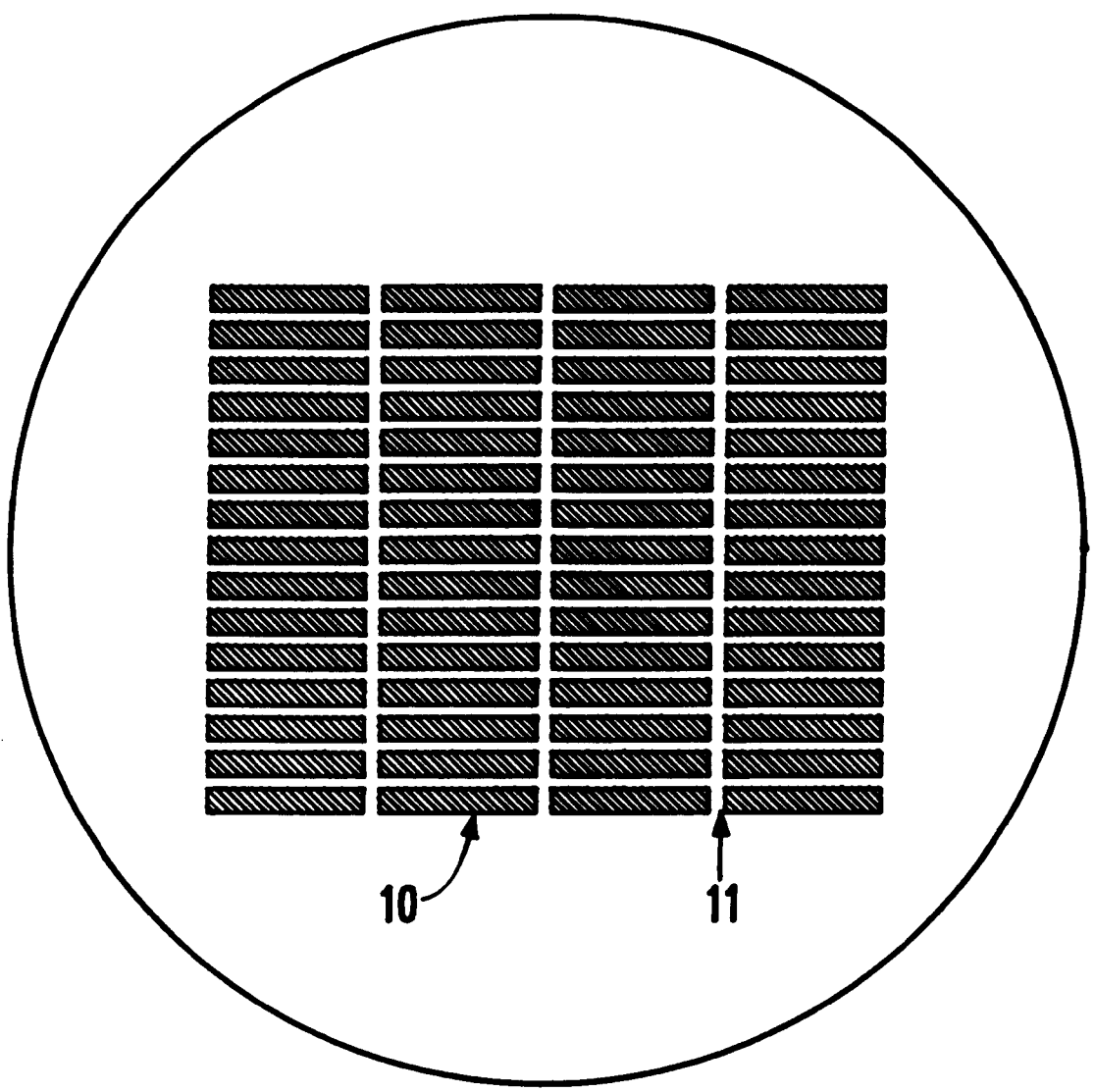
FIG. 1 is a schematic top-view diagram of a mask showing multiple membrane subfields.
Figure 2A:
FIGS. 2A–2F are schematic cross-sectional diagrams of the mask substrate and subfields at various processing stages.
Figure 2B:
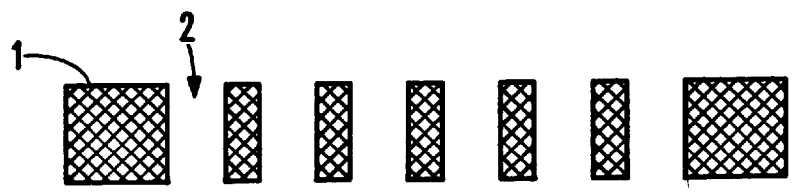

FIGS. 2A–2F illustrate a first embodiment of the invention that begins with a substrate 1 of the strut material 11 (silicon, SiC, diamond or diamond-like-carbon (DLC), polymer, or other), as shown in FIG. 2A. The substrate 1 is mechanically machined to create slots 2 through the substrate 1, as shown in FIG. 2B. Mechanical machining is distinguished from chemical or reactive ion etching in that mechanical machining involves application of a cutting tool against the substrate 1. The slots 2 have the dimensions of desired opening for the membrane subfields 10.

Figure 2C:

The slots 2 are then filled with a sacrificial material 3, as shown in FIG. 2C. The sacrificial material 3 should have properties of reasonable mechanical, chemical, and thermal robustness be easily removed after mask processing is completed, and have the ability to completely fill the slots. Alternately, the sacrificial material to 3 does not need to completely fill the slots 2, so long as the sacrificial material 3 forms a continuous surface along the top of the substrate 1, as shown in FIG. 2C. In other words, air pockets and gaps at the lower side of the substrate will not inhibit the operation of the invention. The sacrificial material 3 could be $SiO_2$ (deposited by chemical vapor deposition-CVD), spin-on-glass, a polymer, CVD organic film, Ti, Al, or other similar substance.

The sacrificial material 3 and the substrate 1 are then polished to a planar surface using well-known polishing techniques (such as Chemical-Mechanical Polishing "CMP"), as shown in FIG. 2C. Note that the substrate and sacrificial material can be overpolished to assure flatness.

Figure 2D:
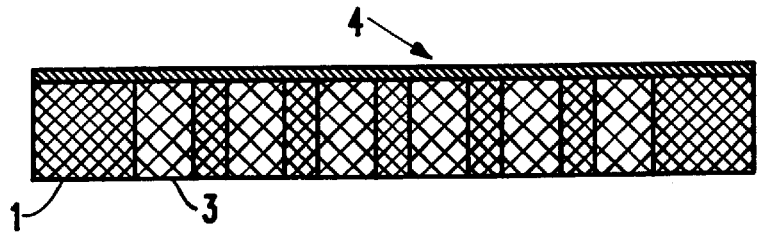
Figure 2E:
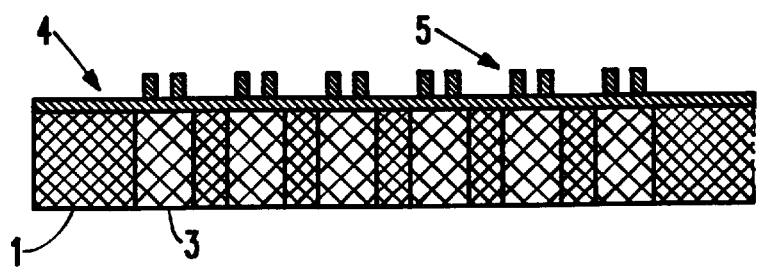

Next, the membrane material 5 is deposited on the surface of the substrate and patterned, as shown in FIG. 2E. The membranes 5 are typically deposited by a CVD technique and are often SiC, SiN, diamond, silicon, or other material. Optionally, a thin intermediate layer 4 could be sputtered on the substrate before the membrane material 5 is deposited, as shown in FIG. 2D. This intermediate layer 4 assists in the nucleation of the membrane deposition and could comprise a material such as sputtered Si, Cr, or Ti.

After the membrane 5 is deposited, the substrate resembles a mask blank as is often used for masks for EPL, IPL, or x-ray lithography. The absorber or stencil mask is then processed by techniques well known in the art. For example, a thin metal layer (such as W or Ta) could be deposited, patterned through e-beam lithography with resists, reactive ion etching of the metal, and removal of the resist. Alternatively, a hardmask can be deposited, patterned through e-beam lithography (with a resist). This would be followed by a subsequent reactive ion etch (RIE) of the hardmask. The hardmask could then be used to etch the membrane to form a stencil mask.

Figure 2F:
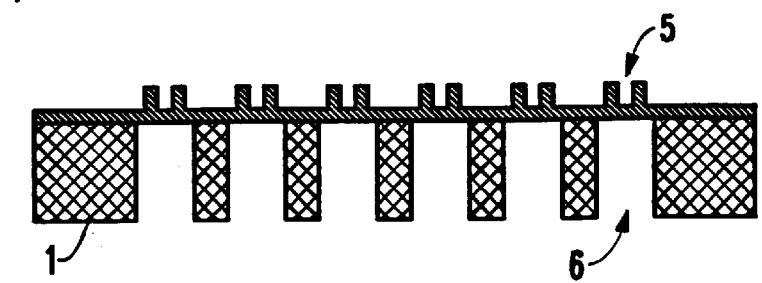

After the absorber or stencil is defined, the sacrificial material 3 is removed with a simple etch (such as BHF for SiO2), as shown by item 6 in Figure 2F, forming the desired membranes.

This embodiment of the invention is superior to conventional processes for a number of reasons. For example, the invention eliminates the long, through-substrate etching by defining the substrate membrane openings through a relatively fast and inexpensive machining process. Further, the invention provides a thick protective layer underneath the membranes during absorber or stencil patterning. In addition, the invention avoids the changes in process integration (such as the buried etch stop layers for deep-Si RIE) during the absorber patterning, that are required conventionally.

Figure 3A:
FIGS. 3A–3G are schematic cross-sectional diagrams of the mask substrate and subfields at various processing stages.
Figure 3B:
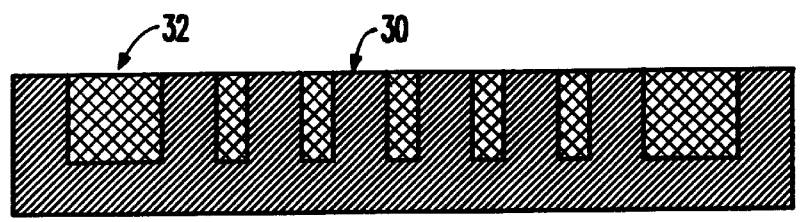
Figure 3C:
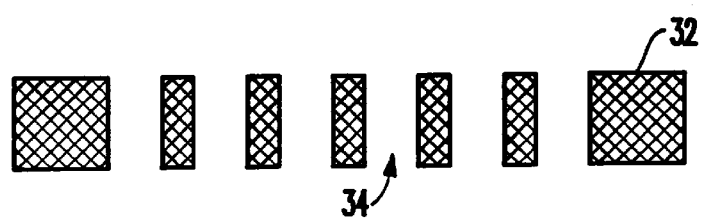
Figure 3D:
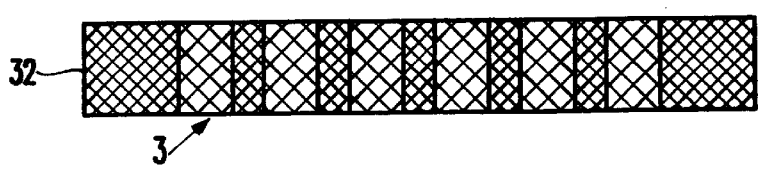
Figure 3E:
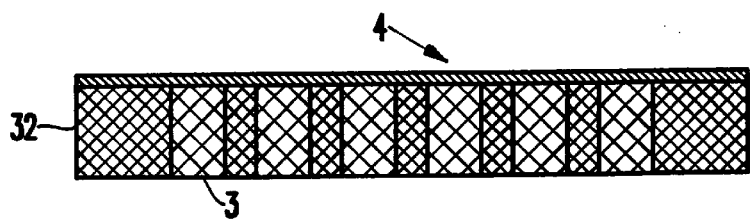
Figure 3F:
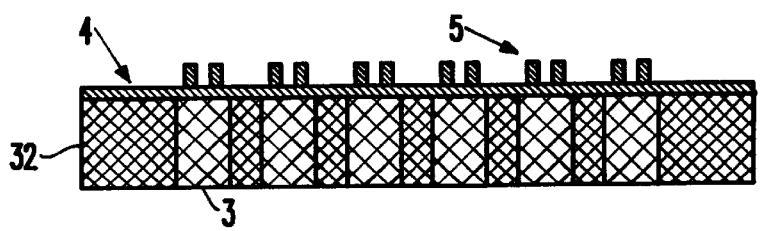
Figure 3G:
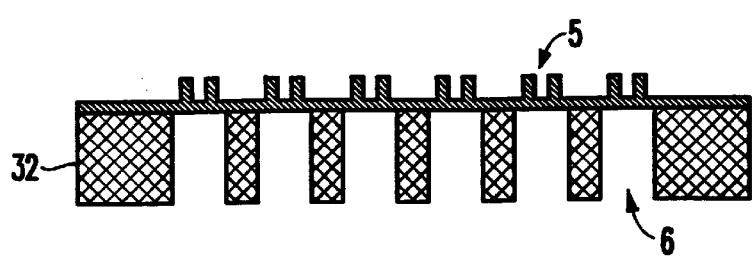

An alternative embodiment of the present invention is shown in FIGS. 3A–3G. This embodiment involves forming the substrate shape using a mold 30. The mold 30 has a shape complementary to the desired substrate shape and can be used, for example in a process similar to injection molding. More specifically, as shown in FIG. 3B, the substrate material 32 is deposited within the mold 30. Then, as shown in FIG. 3C, the mold is removed, creating slots 34 which are substantially similar to the slots 2 discussed above. After the mold is removed, the same processing discussed above with respect FIGS. 2C–2F continues as shown in FIGS. 3D–3G. A redundant discussion of the same is omitted for brevity.

One advantage of the embodiment shown in FIGS. 3A–3G (using the mold) is that it is quicker, cheaper, and easier than machining each substrate. However, mold formation places some limits on the substrate materials that can be used and does not allow for the use of single crystal substrates. To the contrary, the first embodiment (FIGS. 2A–2F) allows the use of any machinable substrate material.

Yet another embodiment of the invention is illustrated in FIGS. 4A–4D. As discussed above with respect to the previous embodiments, a slotted substrate 48 (having slots 40) is supplied. The slotted substrate 48 can be formed using either the mechanical machining method or the mold method discussed above.

Figure 4A:
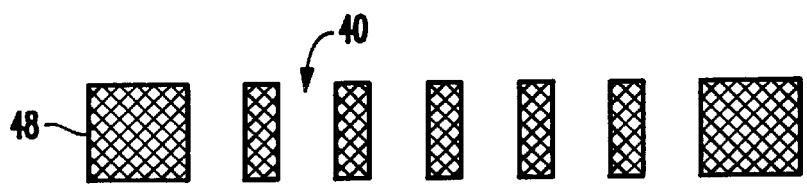
FIGS. 4A–4D are schematic cross-sectional diagrams of the mask substrate and subfields at various processing stages.
Figure 4B:
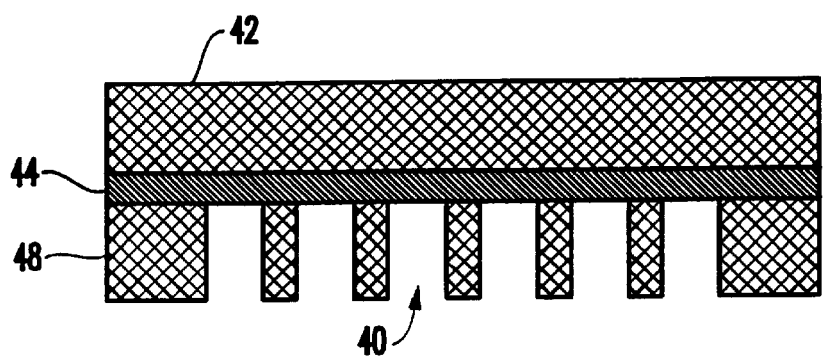
Figure 4C:
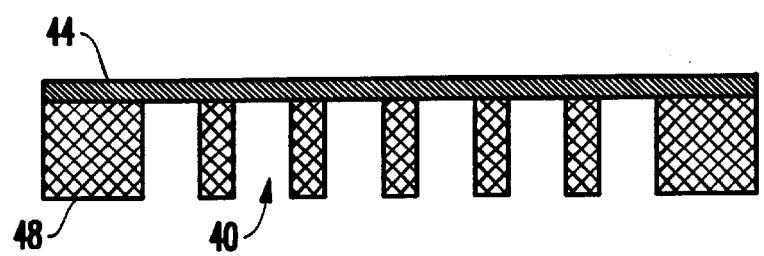
Figure 4D:
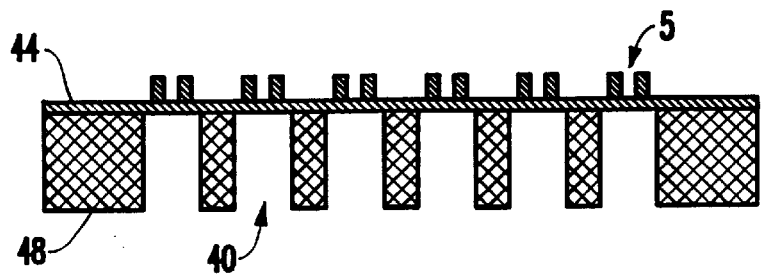

In a separate parallel processing step, a lithographic membrane material 44 is attached to a sacrificial material 42. The sacrificial material 42 can be any of the materials discussed above and should be selectively removable with respect to the substrate 48. After the membrane 44 is attached to the sacrificial material 42, the combined structure 42, 44 is then attached to the slotted substrate 48 using any conventional bonding or attaching process, as shown in FIG. 4B. The sacrificial material 42 is then removed, as shown in FIG. 4C and the membrane material 44 is patterned 5, as shown in FIG. 4D.

This embodiment produces advantages when compared to conventional processing and the process discussed above in that the slots 40 do not need to be filled with a sacrificial material and the substrate does not need to be planarized. This reduces processing complexity and the number of steps required, thereby reducing material cost and the amount of time required to produce the structure.

Figure 5:
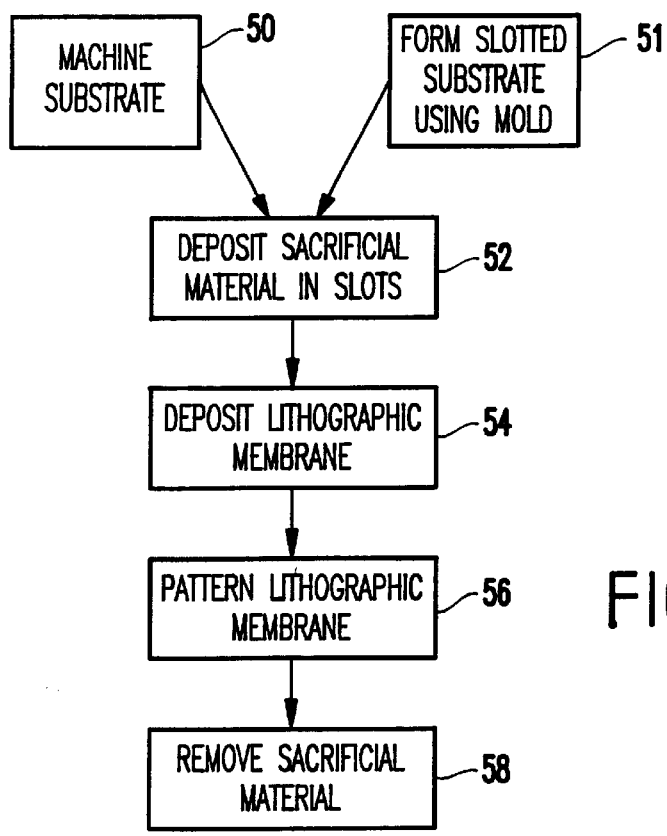
FIG. 5 is a flow diagram illustrating the operation of one embodiment of the invention.

FIG. 5 is a flowchart representation of the embodiments shown in FIGS. 2A–2F and 3A–3G. More specifically, in FIG. 5 item 50 represents the machining of the substrate and item 51 illustrates the formation of the slotted substrate using the mold, as discussed above. In item 52, the sacrificial material is deposited in the slots. Then, the invention deposits the lithographic membrane in item 54 and the same is patterned in item 56. Finally, in item 58 the sacrificial material is removed. As mentioned above, items 56 and 58 can be performed in any order.

Figure 6:
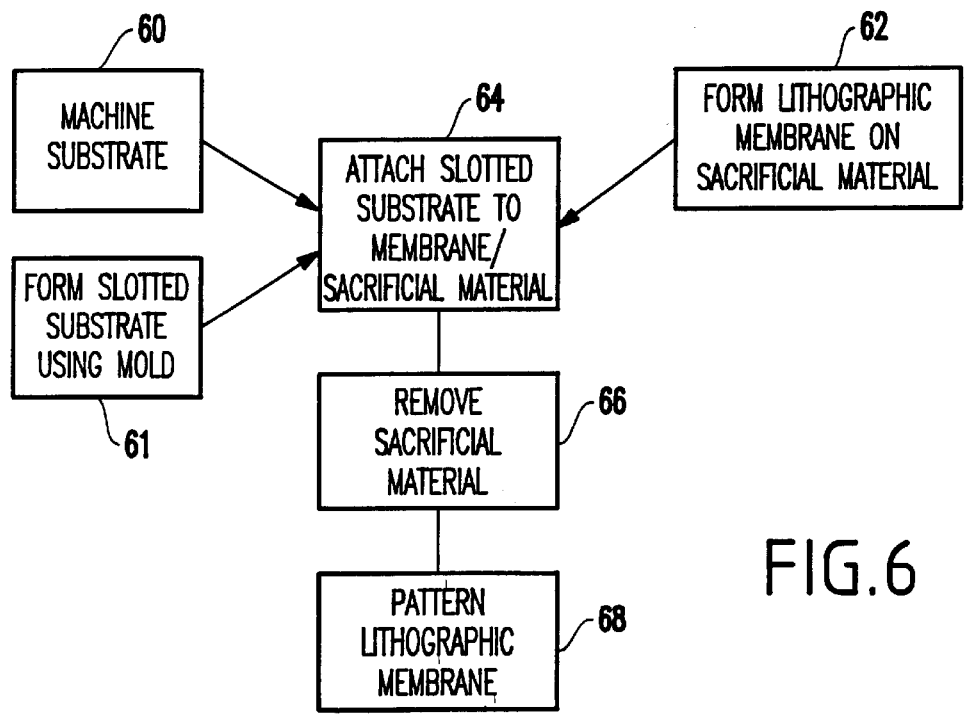
FIG. 6 is a flow diagram illustrating the operation of one embodiment of the invention.

FIG. 6 is a flowchart representation of the embodiment of the invention shown in FIGS. 4A–4D. More specifically, item 60 represents the machining of the substrate and item 61 represents the formation of the slotted substrate using the mold process discussed above. Item 62 represents the forming of the lithographic membrane on the sacrificial material. Item 64 represents the attachment of the slotted substrate to the membrane/sacrificial material. In item 66, the sacrificial material is removed and in item 68 the lithographic membrane is patterned. Again, the processing in items 66 and 68 can be performed in any order.

As mentioned above, the invention is superior to conventional processes for a number of reasons. The invention eliminates the long, through-substrate etching by defining the substrate membrane openings through a relatively fast and inexpensive machining process. Further, the invention provides a thick protective layer underneath the membranes during absorber or stencil patterning. In addition, the invention avoids the changes in process integration (such as the buried etch stop layers for deep-Si RIE) during the absorber patterning, that are required conventionally.

While the invention has been described in terms of preferred embodiments, those skilled in the art will recognize that the invention can be practiced with modification within the spirit and scope of the appended claims.

What is claimed is:

1. A method of forming a mask comprising:
   mechanically machining slots through a substrate, wherein said slots have dimensions of membrane subfields;
   filling said slots with a sacrificial material;
   planarizing said substrate;
   depositing a membrane material over said substrate;
   patterning said membrane material; and
   removing said sacrificial material.

2. The method in claim 1, wherein said patterning of said membrane material includes patterning a lithographic layer upon said membrane material.

3. The method in claim 1, wherein said machining comprises applying a cutting tool to said substrate to form said slots.

4. The method in claim 1, further comprising, before said depositing of said membrane material, depositing an intermediate layer, wherein said intermediate layer assists nucleation of said membrane material.

5. The method in claim 1, wherein said patterning patterns said membrane material in regions above said slots.

6. The method in claim 1, wherein said sacrificial material provides support for said membrane material during said depositing and said patterning of said membrane material.

7. A method of forming a mask comprising:
   forming a mold in a shape complementary to a slotted substrate, wherein said slotted substrate includes slots having dimensions of membrane subfields;
   filling said mold with a substrate material to form said slotted substrate;
   removing said slotted substrate from said mold;
   filling said slots with a sacrificial material;
   planarizing said slotted substrate;
   depositing a membrane material over said slotted substrate;
   patterning said membrane material; and
   removing said sacrificial material.

8. The method in claim 7, wherein said patterning of said membrane material includes patterning a lithographic layer upon said membrane material.

9. The method in claim 7, further comprising, before said depositing of said membrane material, depositing an intermediate layer, wherein said intermediate layer assists nucleation of said membrane material.

10. The method in claim 7, wherein said pattering patterns said membrane material in regions above said slots.

11. The method in claim 7, wherein said sacrificial material provides support for said membrane material during said depositing and said patterning of said membrane.

12. The method in claim 7, wherein, after said planarizing, said substrate and said sacrificial material form a continuous surface along one side of said slotted substrate.

13. A method of forming a lithographic mask comprising:
   providing a slotted substrate having slots;
   depositing a sacrificial material in said slots, wherein said sacrificial material fills at least a portion of said slots;
   planarizing said substrate such that said substrate and said sacrificial material form a continuous surface;
   depositing a lithographic mask material on said substrate;
   patterning said lithographic mask material; and
   removing said sacrificial material,
   wherein said sacrificial material provides support for said lithographic mask material during said depositing and said patterning said lithographic mask material.

14. The method in claim 13, wherein said patterning of said membrane material includes patterning a lithographic layer upon said lithographic mask material.

15. The method in claim 13, wherein said slots have dimensions of membrane subfields.

16. The method in claim 13, wherein said providing of said slotted substrate comprises machining said slots in said slotted substrate.

17. The method in claim 16, wherein said machining comprises applying a cutting tool to said slotted substrate to form said slots.

18. The method in claim 13, wherein said providing of said slotted substrate comprises:
   providing a mold having a complementary shape to said slotted substrate;
   depositing a substrate material in said mold to form said slotted substrate; and
   removing said slotted substrate from said mold.

19. The method in claim 13, further comprising, before said depositing of said lithographic mask material, depositing an intermediate layer, wherein said intermediate layer assists nucleation of said lithographic mask material.

20. The method in claim 13, wherein said patterning patterns said lithographic mask material in regions above said slots.

21. A method of forming a lithographic mask comprising:
   depositing a lithographic mask material on a sacrificial material;
   machining slots in a substrate;
   attaching said lithographic mask material to said substrate;
   removing said sacrificial material; and
   patterning said lithographic mask material,
   wherein said sacrificial material provides support for said lithographic mask material during said attaching.

22. The method in claim 21, wherein said patterning of said lithographic mask material includes patterning a lithographic layer upon said membrane material.

23. The method in claim 21, wherein said slots have dimensions of membrane subfields.

24. The method in claim 21, wherein said machining comprises applying a cutting tool to said substrate to form said slots.

25. The method in claim 21, further comprising, before said depositing of said lithographic mask material, depositing an intermediate layer on said sacrificial material, wherein said intermediate layer assists nucleation of said lithographic mask material.

26. The method in claim 21, wherein said attaching places patterned portions of said lithographic mask material above said slots.

27. A method of forming a lithographic mask comprising:
   depositing a lithographic mask material on a sacrificial material;
   providing a mold having a complementary shape to a slotted substrate, wherein said slotted substrate includes slots;
   depositing a substrate material in said mold to form said slotted substrate;
   removing said slotted substrate from said mold;
   attaching said sacrificial material to said slotted substrate;
   removing said sacrificial material; and
   patterning said lithographic mask material.

28. The method in claim 27, wherein said patterning of said lithographic mask material includes patterning a lithographic layer upon said membrane material.

29. The method in claim 27, wherein said slots have dimensions of membrane subfields.

30. The method in claim 27, further comprising, before said depositing said lithographic mask material, depositing an intermediate layer on said sacrificial material, wherein said intermediate layer assists nucleation of said lithographic mask material.

31. The method in claim 27, wherein said patterning patterns said lithographic mask material in regions above said slots.

32. The method in claim 27, wherein said sacrificial material provides support for said lithographic mask material during said attaching.

33. A method of forming a lithographic mask comprising:

depositing a lithographic mask material on a sacrificial material;

attaching said lithographic mask material to a slotted substrate;

removing said sacrificial material; and patterning said lithographic mask material, wherein said sacrificial material provides support for said lithographic mask material during said attaching.

34. The method in claim 33, wherein said patterning of said lithographic mask material includes patterning a lithographic layer upon said membrane material.

35. The method in claim 33, wherein slots in said slotted substrate have dimensions of membrane subfields.

36. The method in claim 33, further comprising machining slots in said slotted substrate wherein said machining comprises applying a cutting tool to said slotted substrate to form said slots.

37. The method in claim 33, further comprising:

providing a mold having a complementary shape to said slotted substrate;

depositing a substrate material in said mold to form said slotted substrate; and removing said slotted substrate from said mold.

38. The method in claim 33, further comprising, before said depositing of said lithographic mask material, depositing an intermediate layer on said sacrificial material, wherein said intermediate layer assists nucleation of said lithographic mask material.

39. The method in claim 33, wherein said attaching places patterned portions of said lithographic mask material above slots in said slotted substrate.

* * * * *